United States Patent
Lee et al.

(10) Patent No.: US 10,572,158 B2
(45) Date of Patent: Feb. 25, 2020

(54) METHOD OF OPERATING STORAGE DEVICE TO RECOVER PERFORMANCE DEGRADATION DUE TO RETENTION CHARACTERISTIC AND METHOD OF OPERATING DATA PROCESSING SYSTEM INCLUDING THE SAME

(71) Applicant: Samsung Electronics Co., Ltd., Suwon-si (KR)

(72) Inventors: Sang Yong Lee, Hwaseong-si (KR); Shin Wook Gahng, Suwon-si (KR); Chul Lee, Hwaseong-si (KR)

(73) Assignee: SAMSUNG ELECTRONCIS CO., LTD., Gyeonggi-do (KR)

( * ) Notice: Subject to any disclaimer, the term of this patent is extended or adjusted under 35 U.S.C. 154(b) by 571 days.

(21) Appl. No.: 15/291,094

(22) Filed: Oct. 12, 2016

(65) Prior Publication Data
US 2017/0147209 A1 May 25, 2017

(30) Foreign Application Priority Data
Nov. 20, 2015 (KR) .................. 10-2015-0163604

(51) Int. Cl.
*G11C 29/00* (2006.01)
*G06F 3/06* (2006.01)
(Continued)

(52) U.S. Cl.
CPC .............. *G06F 3/061* (2013.01); *G06F 3/064* (2013.01); *G06F 3/0619* (2013.01);
(Continued)

(58) Field of Classification Search
CPC .......... G06F 11/00; G06F 11/07; G06F 11/10; G06F 11/1068; G06F 3/06; G06F 3/061;
(Continued)

(56) References Cited

U.S. PATENT DOCUMENTS 7,697,315 B2  4/2010  Iwanari
8,144,539 B2  3/2012  Lim et al.
(Continued)

FOREIGN PATENT DOCUMENTS

KR   10-2012-0091906    8/2012

*Primary Examiner* — Albert Decady
*Assistant Examiner* — Enamul M Kabir
(74) *Attorney, Agent, or Firm* — Muir Patent Law, PLLC

(57) ABSTRACT

A storage device may include a plurality of memory cells arranged in pages and blocks, each page including a row of memory cells, and each block including a plurality of pages of memory cells. The storage device may include a memory device, such as a nonvolatile memory device, which includes these items. A data recovery method for the storage device may include receiving by the storage device a first command corresponding to a first selected data recovery scheme. Based on the first command: a first target page scheme for performing error detection on the plurality of blocks is applied, target pages are read using the first target page scheme, and an amount of errors in each read target page is detected. In addition, it may be determined that a target page of a first block has at least a first threshold amount of errors, and based on the determination, data recovery for the first block may be performed by relocating all data stored in the first block to another block. Further, it may be determined that no read page in a second block has at least the first threshold amount of errors, and as a result, the data stored in the second block can be maintained.

17 Claims, 17 Drawing Sheets

(51) Int. Cl.
   *G06F 11/10* (2006.01)
   *G11C 29/52* (2006.01)
(52) U.S. Cl.
   CPC .......... *G06F 3/0659* (2013.01); *G06F 3/0679* (2013.01); *G06F 11/1068* (2013.01); *G11C 29/52* (2013.01)
(58) Field of Classification Search
   CPC ...... G06F 3/0619; G06F 3/064; G06F 3/0659; G06F 3/0679; G11C 11/34; G11C 16/04; G11C 16/06; G11C 2029/0409; G11C 2029/0411; G11C 29/42; G11C 29/52; G11C 29/76
   USPC .......................................................... 714/764
   See application file for complete search history.

(56) References Cited

U.S. PATENT DOCUMENTS

| | | |
|---|---|---|
| 8,775,874 B2 | 7/2014 | Chu |
| 2010/0162081 A1* | 6/2010 | Joo ..................... G06F 11/1048 714/763 |
| 2010/0235568 A1 | 9/2010 | Inamura |
| 2012/0176829 A1 | 7/2012 | Kang et al. |
| 2012/0210076 A1 | 8/2012 | Jang et al. |
| 2012/0311381 A1* | 12/2012 | Porterfield .......... G06F 11/1004 714/6.22 |
| 2013/0159814 A1* | 6/2013 | Hashimoto ............ G11C 29/04 714/773 |
| 2013/0346671 A1* | 12/2013 | Michael ............... G06F 12/0246 711/103 |
| 2014/0136925 A1* | 5/2014 | Joo ..................... G06F 11/1048 714/764 |
| 2014/0289559 A1* | 9/2014 | Hashimoto ............ G11C 29/08 714/27 |
| 2014/0310445 A1 | 10/2014 | Fitzpatrick et al. |
| 2014/0362648 A1 | 12/2014 | Hwang |
| 2014/0380122 A1* | 12/2014 | Myung ............... G06F 11/1008 714/764 |
| 2015/0039948 A1 | 2/2015 | Um et al. |
| 2015/0062607 A1 | 3/2015 | Higashi |
| 2015/0143054 A1* | 5/2015 | Ackaret ................ G06F 11/073 711/133 |
| 2015/0199232 A1* | 7/2015 | Tressler ............... G06F 11/1068 714/755 |
| 2015/0378800 A1* | 12/2015 | Suzuki ................... G06F 12/16 714/49 |
| 2016/0034206 A1* | 2/2016 | Ryan ................... G11C 16/349 711/103 |
| 2016/0124679 A1* | 5/2016 | Huang ................ G06F 3/0647 711/103 |
| 2016/0266817 A1* | 9/2016 | Kamimura ............ G06F 3/0616 |

\* cited by examiner

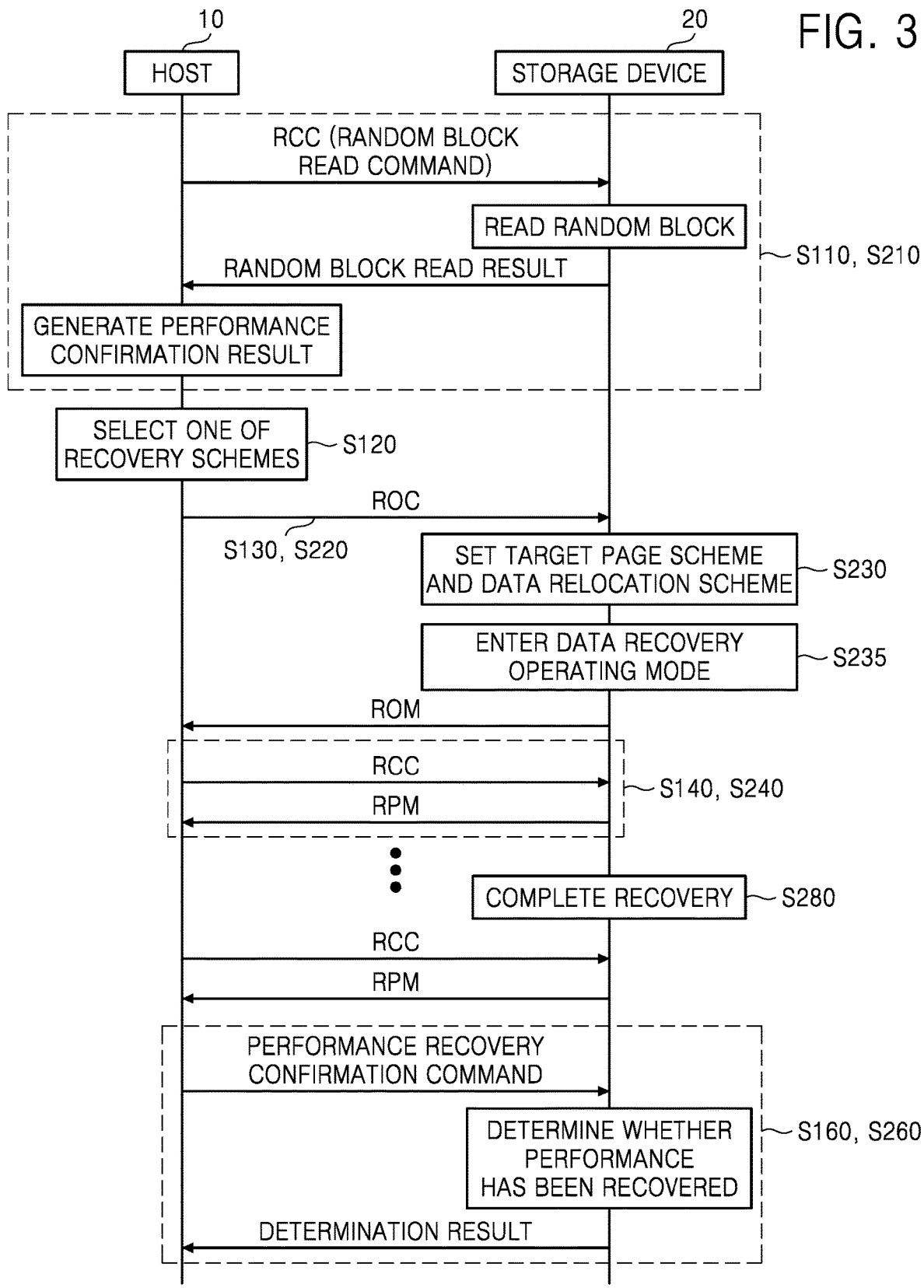

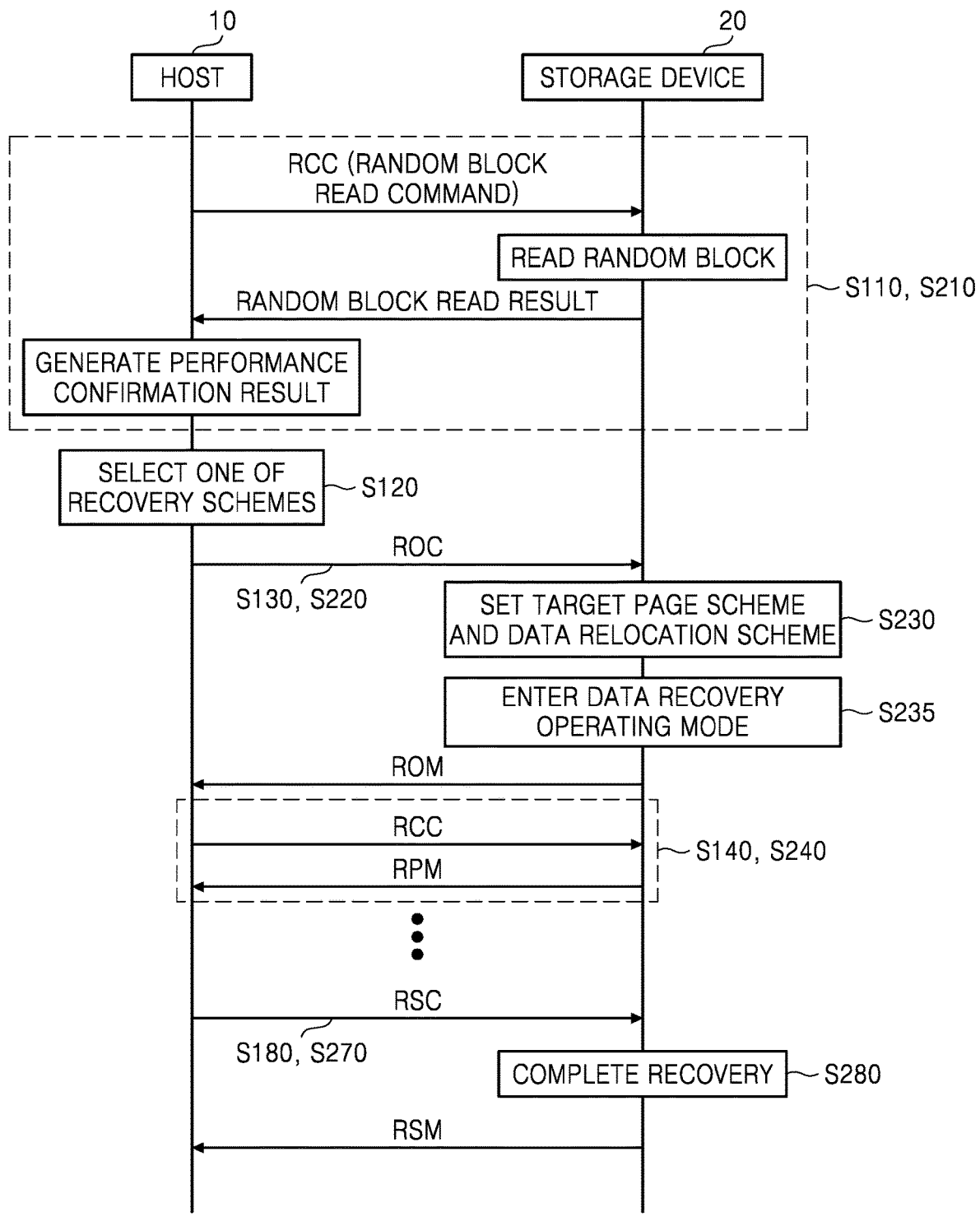

FIG. 6

| For Tested Block Largest Page Bit Error Level During Detection | Use Data Relocation For Block? |
|---|---|
| Highest (ER4) | Yes |
| High (ER3) | Yes |
| Moderate (ER2) | Yes |
| Low (ER1) | No |

FIG. 7

| For Tested Block Largest Page Bit Error Level During Detection | Use Data Relocation For Block? |
|---|---|
| Highest (ER4) | Yes |
| High (ER3) | Yes |
| Moderate (ER2) | No |
| Low (ER1) | No |

FIG. 8

| For Tested Block Largest Page Bit Error Level During Detection | Use Data Relocation For Block? |
|---|---|
| Highest (ER4) | Yes |
| High (ER3) | No |
| Moderate (ER2) | No |
| Low (ER1) | No |

FIG. 9

| For Tested Block Largest Page Bit Error Level During Detection | Use Data Relocation For Block? |
|---|---|
| Highest (ER4) | No |
| High (ER3) | No |
| Moderate (ER2) | No |
| Low (ER1) | No |

FIG. 10

| Data,Recovery,When Normal,Read,Operation Performed | Error Correction Using,LDPC (H/W) | Error Correction Using Algorithm (S/W) | Data relocation |
|---|---|---|---|
| Highest (ER4) |  | X | Yes |
| High (ER3) |  | X |  |
| Moderate (ER2) |  | X |  |
| Low (ER1) | X |  |  |

METHOD OF OPERATING STORAGE DEVICE TO RECOVER PERFORMANCE DEGRADATION DUE TO RETENTION CHARACTERISTIC AND METHOD OF OPERATING DATA PROCESSING SYSTEM INCLUDING THE SAME

CROSS-REFERENCE TO RELATED APPLICATIONS

This application claims priority under 35 U.S.C. § 119(a) to Korean Patent Application No. 10-2015-0163604 filed on Nov. 20, 2015, the disclosure of which is hereby incorporated by reference in its entirety.

BACKGROUND

This disclosure relates to a technique of recovering read performance degradation of a storage device, and more particularly, to a method of operating a storage device to recover performance degradation due to a retention characteristic and a method of operating a data processing system including the same.

Memory devices that store data may be volatile memory devices or non-volatile memory devices. A flash memory device is an example of electrically erasable programmable read-only memory (EEPROM) in which a plurality of memory cells are erased or programmed in a single program operation.

A program operation and a read operation are performed on each page and an erase operation is performed on each block. Flash memory devices include a memory cell array, which includes a plurality of blocks. Each of the blocks includes a plurality of pages. Each of the pages may include a plurality of non-volatile memory cells, and may include one or more rows of memory cells. Flash memory devices may be divided into NAND-type flash memory devices and NOR-type flash memory devices.

A flash memory cell includes a floating gate. Charges stored in a floating gate (i.e., charges related with information) are lost a long time after the information is stored in the flash memory cell. Accordingly, a distribution characteristic degrades. When retention lasts for a long time without being powered, the threshold voltage of the flash memory cell is changed. When the changed threshold voltage is lower than a read voltage, a value of a bit read from the flash memory cell during a read operation is changed. As a result, information read from the flash memory could be an error bit.

When threshold voltages of at least some of flash memory cells included in a page are changed, page data corresponding to the page may include a lot of error bits, also described as bit errors. When a read operation is performed on these flash memory cells, serious read performance degradation could occur due to excessive execution of an algorithm for recovering error bits and such read performance degradation could last for a long time.

In order to avoid the performance degradation due to flash memory cells on which the algorithm for recovering error bits are excessively performed, data relocation may be performed on the flash memory cells. However, since the performance degradation could get worse during the data relocation, the criteria of data relocation are usually conservative. For instance, when an error bit level of flash memory cells is lower than a certain level, only an algorithm for recovering error bits is performed. In other cases, both an algorithm and data relocation are performed. Once flash memory cells are subjected to data relocation, they are not subjected to the algorithm for recovering error bits any more until their retention begins to deteriorate, and therefore, there is no initial performance degradation.

SUMMARY

As described above, when error bits increase due to retention problems, an algorithm for recovering the error bits may be excessively performed on flash memory cells, which may lead to serious read operation degradation. This performance degradation may not be recovered until data relocation is performed. When the state of most of flash memory cells in a device stays at a level which allows the algorithm for recovering error bits to be performed to an excessive extent but does not allow the data relocation, users may suffer continuous severe read performance degradation.

Some embodiments of the inventive concept provide a method of operating a storage device to select one of a plurality of recovery schemes and perform a recovery operation corresponding to the selected recovery scheme in order to recover performance degradation due to a retention characteristic and a method of operating a data processing system including the storage device.

A storage device may include a plurality of memory cells arranged in pages and blocks, each page including a row of memory cells, and each block including a plurality of pages of memory cells. The storage device may include a memory device, such as a nonvolatile memory device, which includes these items.

In some implementations, a data recovery method for a storage device includes receiving by the storage device a first command corresponding to a first selected data recovery scheme. Based on the first command: a first target page scheme for performing error detection on the plurality of blocks is applied, target pages are read using the first target page scheme, and an amount of errors in each read target page is detected. In addition, it may be determined that a target page of a first block has at least a first threshold amount of errors, and based on the determination, data recovery for the first block may be performed by relocating all data stored in the first block to another block. Further, it may be determined that no read page in a second block has at least the first threshold amount of errors, and as a result, the data stored in the second block can be maintained.

In some implementations, which may be the same as or different implementations from the above implementation, a data recovery method for a storage device includes: using a first data recovery procedure at the storage device to recover data on the storage device, the first data recovery procedure using a first data relocation scheme that relocates a block of data when at least one page of the block has at least a first threshold amount of errors, receiving at the storage device a command to use a second, different data recovery procedure; and in response to the command, using the second data recovery procedure at the storage device to recover data on the storage device. The second data recovery procedure uses a second data relocation scheme that relocates a block of data when at least one page of the block has at least a second threshold amount of errors, the second threshold amount being smaller than the first threshold amount.

In some implementations, which may be the same as or different implementations from the above implementations, a data recovery method for a memory device includes: determining, by a host, a first performance level of the memory device; based on the first performance level, selecting a data relocation scheme from among a plurality of data relocation schemes, the plurality of data relocation schemes including a first data relocation scheme and a second data relocation scheme; and sending, by the host, a first command to perform a first data recovery procedure on the memory device. The first data recovery procedure includes using the first data relocation scheme, which relocates a block of data of the memory device when at least one page of the block has at least a first threshold amount of errors.

In some implementations, which may be the same as or different implementations from the above implementations, a storage device includes a memory device including a plurality of memory cells arranged in pages and blocks, each page including a row of memory cells, and each block including a plurality of pages of memory cells, and a memory controller. The memory controller is configured to perform certain steps during a data recovery operating mode. These steps include, for example: applying a selected target page scheme for performing error detection; reading target pages of the memory device using the target page scheme, and detecting an amount of errors in each read target page; when it is determined that a target page of a block has at least a threshold amount of errors, performing data recovery for that block by relocating all data stored in the block to another block; and when no read page in a block has at least the threshold amount of errors, maintaining the data in that block. The memory controller is configured to change the threshold amount of errors.

In some implementations, which may be the same as or different from the above implementations, a system includes a host and a storage device. The storage device includes a memory device including a plurality of memory cells arranged in pages and blocks, each page including a row of memory cells, and each block including a plurality of pages of memory cells, and a memory controller in communication with the host and the memory device. The host is configured to select a first data relocation scheme from among a plurality of data relocation schemes, the plurality of data relocation schemes including the first data relocation scheme and a second data relocation scheme; and send a first command to the memory controller to perform a first data recovery procedure on the memory device. The first data recovery procedure includes using the first data relocation scheme, which relocates a block of data of the memory device when at least one page of the block has at least a first threshold amount of errors. The storage device is configured to receive the first command; and perform the first data recovery procedure in response to the first command.

BRIEF DESCRIPTION OF THE DRAWINGS

The above and other features and advantages of the inventive concept will become more apparent by describing in detail exemplary embodiments thereof with reference to the attached drawings in which:

FIG. 3 is a flowchart of a method of operating a data processing system according to some embodiments;

FIG. 4 is a flowchart of a method of operating a data processing system according to some embodiments;

FIG. 6 is a table of the criteria of data relocation in a first data recovery scheme according to some embodiments;

FIG. 7 is a table of the criteria of data relocation in a second data recovery scheme according to some embodiments;

FIG. 8 is a table of the criteria of data relocation in a third data recovery scheme according to some embodiments;

FIG. 9 is a table of the criteria of data relocation in a fourth data recovery scheme according to some embodiments;

FIG. 10 is a table showing an exemplary data recovery scheme used during a normal operation of a device;

Figure 1A:
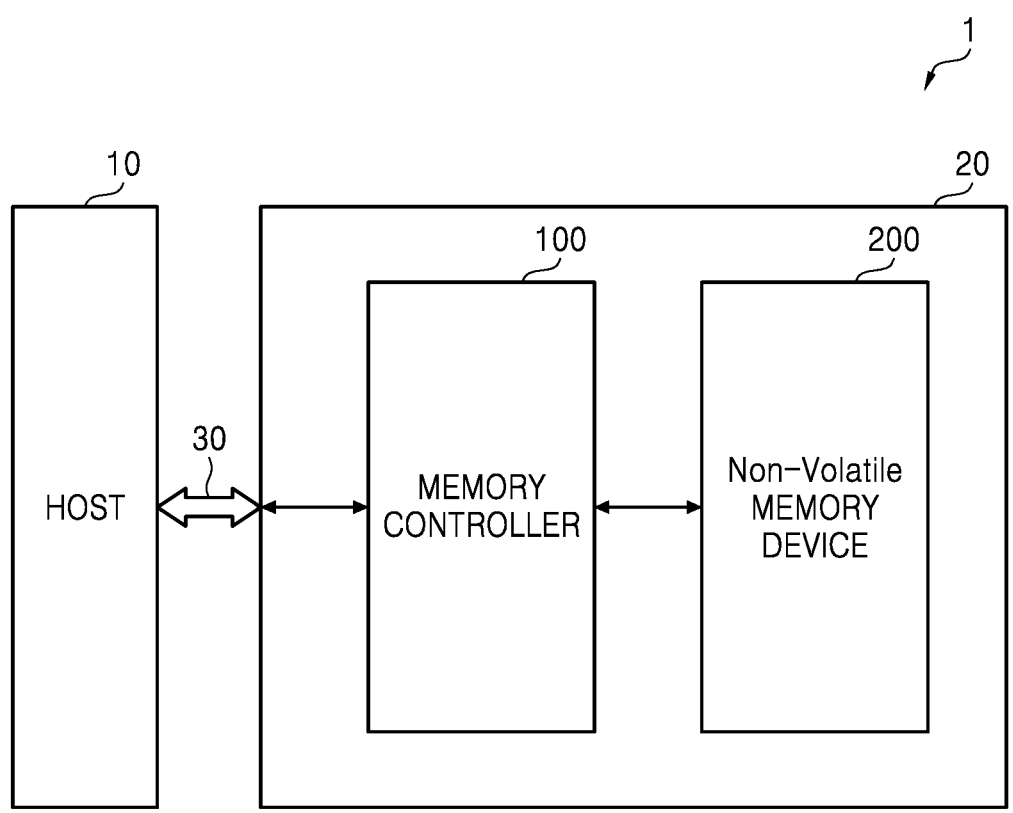
FIG. 1A is a block diagram of a data processing system according to some embodiments.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

DETAILED DESCRIPTION OF THE EMBODIMENTS

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that— examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

As is traditional in the field of the disclosed technology, features and embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

Flash memory devices may include a memory cell array, which may include a plurality of blocks. Each of the blocks may include a plurality of pages. Each of the pages may include a plurality of memory cells. Each page may be defined by a plurality of memory cells connected to at least one word line. For example, a row of memory cells connected to a word line may constitute a page.

In certain embodiments, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In certain embodiments, the 3D memory array includes vertical NAND strings that are vertically oriented such that at least one memory cell is located over another memory cell. The at least one memory cell may comprise a charge trap layer.

The following patent documents, each of which is hereby incorporated by reference in its entirety, describe suitable configurations for three-dimensional memory cell arrays, in which the three-dimensional memory cell array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

When a flash memory cell (e.g., a NAND-type flash memory cell) is left alone (which may be described as "power-off") for a long time after charges (or information corresponding to the charges) are stored in a floating gate or a charge trap layer of the flash memory cell, the charges stored in the floating gate or the charge trap layer may be lost or leaked. When a flash memory cell (e.g., a NAND-type flash memory cell) is left alone for a long time, electrons leak out, degrading a distribution. Such characteristic is called a retention characteristic, whereby the retention characteristic may be degraded or weakened.

A memory cell with weak retention time may generate an error bit due to retention. When a read operation is repeatedly performed on such memory cell, the threshold voltage of the memory cell increases.

FIG. 1A is a block diagram of a data processing system 1 according to some embodiments. The data processing system 1 may include a host 10, a storage device 20, and an interface 30. The data processing system 1 may be implemented, for example, as a personal computer (PC), a workstation, a data center, an internet data center (IDC), a direct attached storage (DAS) system, a storage area network (SAN) system, a network-attached storage (NAS) system, a redundant array of inexpensive disks or redundant array of independent disks (RAID) system, or a mobile device, but the data processing system is not restricted to these examples. A mobile device may be implemented, for example, as a laptop computer, a cellular phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an internet of things (IoT) device, an internet of everything (IoE) device, a drone, or an e-book.

The host 10 may control a data processing operation (e.g., a write operation or a read operation) of the storage device 20 through the interface 30. The host 10 may be a host controller. The host 10 may be implemented as a host processor, an integrated circuit (IC), a motherboard, a system on chip (SoC), an application processor (AP), a mobile AP, a web server, a data server, or a database server, but the disclosure is not restricted to these examples.

The storage device 20 may communicate a command and/or data with the host 10 through the interface 30. The storage device 20 may be a flash-based storage but is not restricted thereto. The storage device 20 may be implemented as a solid state drive (SSD), an embedded SSD (eSSD), a universal flash storage (UFS), a multimedia card (MMC), an embedded MMC (eMMC), or a managed NAND, but the disclosure is not restricted to these examples. The storage device 20 may include a memory controller 100 and a non-volatile memory device 200.

The memory controller 100 may control the transfer or processing of a command and/or data transmitted to or received from the non-volatile memory device 200. The memory controller 100 may be implemented as an IC or a SoC, but the disclosure is not restricted to these examples. For instance, the memory controller 100 may write data from the host 10 to the non-volatile memory device 200 and may transmit data read from the non-volatile memory device 200 to the host 10. The memory controller 100 may include an error correction code (ECC) engine (not shown).

The ECC engine may correct an error in data to be stored in the non-volatile memory device 200 and/or data that has been stored in the non-volatile memory device 200. The error correction of the ECC engine may be performed using a hardware method (e.g., a method using a low-density parity-check (LDPC) code) or a software method (e.g., a method using an algorithm for recovering error bits), but the inventive concept is not restricted to these examples. The ECC engine may include an ECC decoder (not shown) which decodes using either or both of hard decision data and soft decision data.

The memory controller 100 may perform an error correction using a predetermined algorithm. The error correction using the predetermined algorithm may include a method of changing a read level of memory cells and finding an optimal read level. When an error is corrected using the predetermined algorithm, a host may repeatedly perform a read operation on a storage device, in which a distribution characteristic has been degraded because it is left along for a long time, using a different read level in order to find an optimal read level. A read level may include at least one voltage level based on which hard decision data or soft decision data is read from a plurality of memory cells included in the non-volatile memory device 200. An optimal read level may be a voltage corresponding to a valley of the distribution of threshold voltages. The ECC engine may be implemented any where inside the memory controller 100.

The interface 30 may be a transmission path of a command and/or data between the host 10 and the storage device 20. The interface 30 may be may be implemented as a serial advanced technology attachment (SATA) interface, a SATA express (SATAe) interface, a SAS (serial attached small computer system interface (SCSI)), a peripheral component interconnect express (PCIe) interface, a non-volatile memory express (NVMe) interface, an advanced host controller interface (AHCI), or an MNIC interface, but the inventive concept is not restricted to these examples. The interface 30 may transmit electrical signals or optical signals.

Figure 1B:
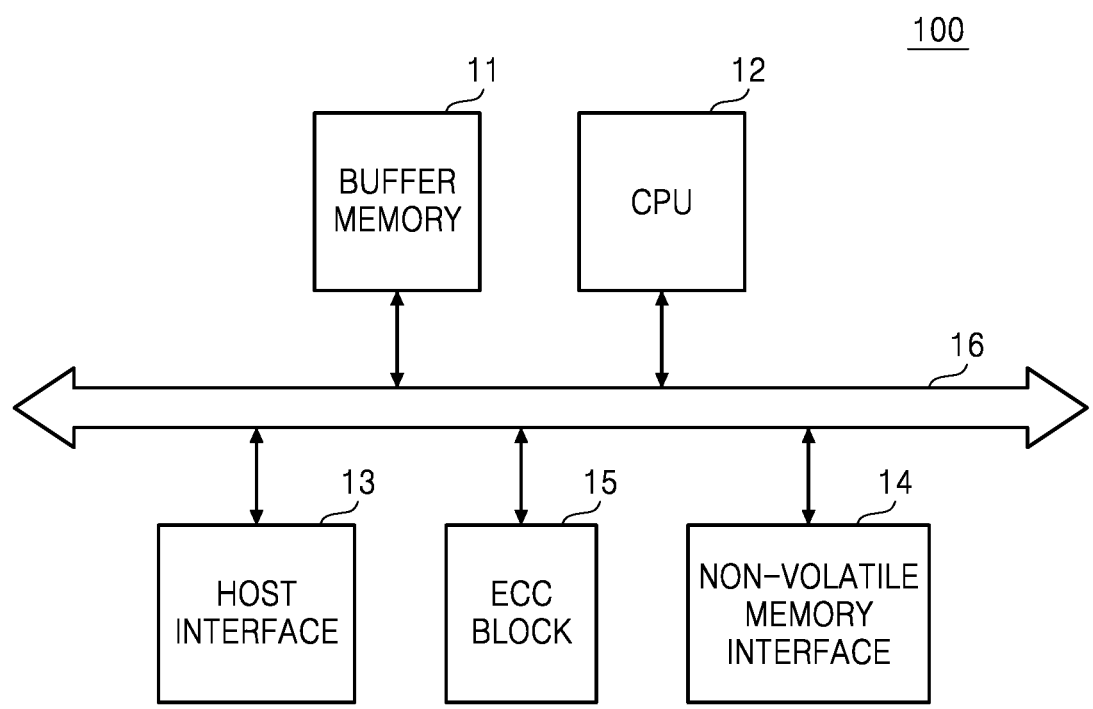
FIG. 1B is a block diagram of a memory controller according to some embodiments.

FIG. 1B is a block diagram of the memory controller 100 according to some embodiments of the inventive concept. Referring to FIG. 1B, the memory controller 100 may include a buffer memory 11, a central processing unit (CPU) 12, a host interface 13, a non-volatile memory interface 14, an ECC block 15, and bus architecture 16.

The buffer memory 11 may store data to be processed by the CPU 12 or data that has been processed by the CPU 12. The buffer memory 11 may be main memory and may be implemented as NAND-type flash memory. Although the buffer memory 11 is placed within the memory controller 100 in the embodiments illustrated in FIG. 1B, the buffer memory 11 may be placed outside the memory controller 100. The buffer memory 11 may store recovery scheme information and target page information. The buffer memory 11 may be implemented by read-only memory (ROM), random access memory (RAM), dynamic RAM (DRAM), static RAM (SRAM), a buffer, buffer memory, a cache, or a tightly coupled memory (TCM), but the disclosure is not restricted to these examples.

The CPU 12 may generate a write request for controlling a write operation of the storage device 20 and a read request for controlling a read operation of the storage device 20. The CPU 12 may communicate a command and/or data with the host interface 13 or the non-volatile memory interface 14 through the bus architecture (or bus) 16. The write request may include a write address and the read request may include a read address. The CPU 12 may include at least one core. The request may be a command.

The host interface 13 may change information input by a user into the format of data to be input to the buffer memory 11 or the CPU 12 and may transmit the data in a changed format to the buffer memory 11 or the CPU 12 through the bus architecture 16. The non-volatile memory interface 14 may change the format of a command and/or data to be transmitted to the storage device 20 and may transmit the command and/or data in a changed format to the storage device 20 through the interface 30. The non-volatile memory interface 14 may also change the format of a response and/or data received from the storage device 20 and may receive a response and/or data in a changed format.

The host interface 13 may be called a host interface logic (or an interface logic circuit) and the non-volatile memory interface 14 may be called a non-volatile memory interface logic (or a non-volatile memory interface logic circuit). The non-volatile memory interface 14 may include a transceiver which transmits and receives commands and/or data. The structure and operations of the non-volatile memory interface 14 may be configured to be compatible with the structure and operations of the interface 30.

The ECC block 15 may correct errors in data to be transmitted to the storage device 20 and/or in data received from the storage device 20. The ECC block 15 may be implemented anywhere inside the memory controller 100.

The bus architecture 16 may allow commands and/or data to move among the buffer memory 11, the CPU 12, the host interface 13, the non-volatile memory interface 14, and the ECC block 15. The bus architecture 16 may be implemented as advanced microcontroller bus architecture (AMBA), an advanced high-performance bus (AHB), an advanced peripheral bus (APB), an advanced extensible interface (AXI), an advanced system bus (ASB), an AXI coherency extensions (ACE), or a combination thereof, but the inventive concept is not restricted to these examples.

Figure 2:
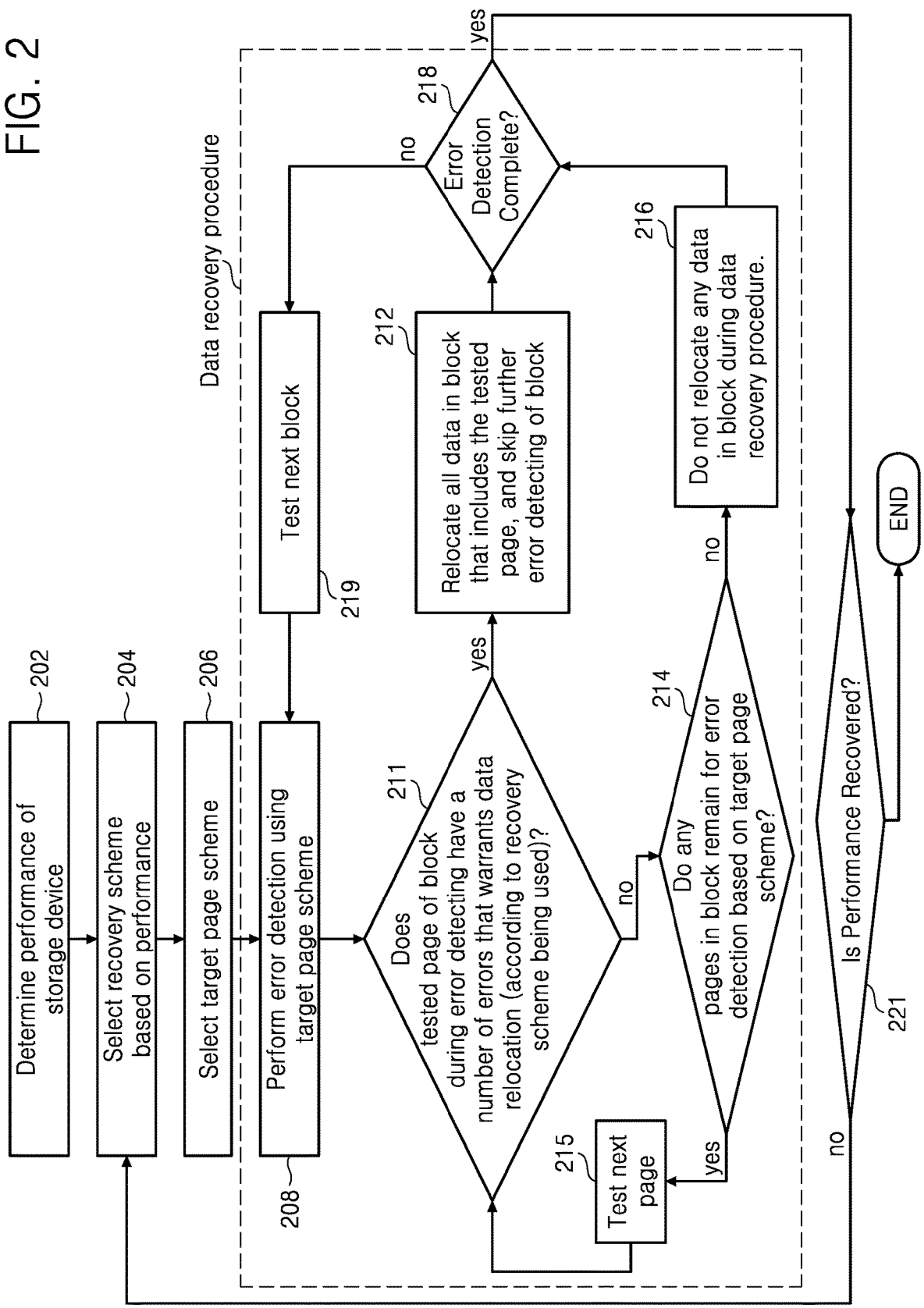
FIG. 2 is a flowchart of the operation of a data recovery method according to some embodiments.

FIG. 2 is a flowchart of the operation of a data recovery method for a storage device according to some embodiments. The data recovery method may be performed during a period of operation when normal read, write, or erase operation is not occurring. The period during which the data recover method is performed may be referred to as a data recovery operating mode, as opposed to a normal read operating mode for the storage device. The various steps shown in FIG. 2 may occur in the order shown, or may occur in other orders consistent with the description that follows. In addition, certain steps may be performed by different entities (e.g., user, controller, host, etc.).

In step 202, the performance of a storage device is determined. The storage device may be, for example, one of the storage devices described above. The storage device may include a memory cell array including a plurality of memory cells arranged in pages and blocks, each page including one or more rows of memory cells, and each block including a plurality of pages of memory cells. The performance of the storage device may be accomplished, for example, by performing a sample read operation on the storage device in order to read one or more pages of the storage device. The sample read operation may be initiated, for example, by as user, or by the host automatically. As a result, the host may obtain results of the sample read operation in the form of operational characteristics, which may be used to determine the performance level. For example, a performance level may reflect a speed of the read operation. Though a simple read operation is explained above, a more complex evaluation (such as a plurality of read operations) may be used to determine the performance of the storage device.

In step 204, a recovery scheme is selected based on the determined performance. The recovery scheme is to be used during a data recovery operation mode of the storage device to recover data. For example, if performance is within a first range (e.g., speed is between an particular upper and lower value, or is above a particular threshold speed, or below a particular threshold speed), then a first recovery scheme may be used, if the performance is in a second range, a second recovery scheme may be used, and if the performance is in a third range, a third recovery scheme may be used, etc. The recovery scheme may be selected by a user who reviews the results of the testing (e.g., the determined performance level), or may be selected automatically by the host based on the results of the testing. For example, the host may be programmed to perform the testing and then as a result of the performance level determined during the testing, to select a recovery scheme. Different selectable recovery schemes are discussed further below in connection with FIGS. 6-9. These recovery schemes may more specifically refer to data relocation schemes, also described further below.

In step 206, a target page scheme is selected. The target page scheme may be selected, for example, by a user entering information into the host, which then selects the scheme based on the user-entered information, or may be selected by a host automatically. The target page scheme may be selected as part of the recovery scheme selection process, or may be separately selected. Thus, it may be selected before, at the same time as, or after selection of the recovery scheme.

The target page scheme refers to which pages of the storage device will be accessed (e.g., read) during a testing or error detection phase of the data recovery procedure for the storage device. For example, the target page scheme may designate the number of pages read, as well as which pages to read. For example, a first target page scheme may read/test every page in every block of the storage device. A second target page scheme may read/test just one representative page of each block of the storage device or a subset of pages but not all pages in each block of the storage device. A third target page scheme may randomly select pages within the storage device for reading/testing.

In step 208, the selected target page scheme is applied, and error detection is performed on selected pages. For example, for each tested page, the amount of errors that occurs in that page may be determined.

In step 211, for each tested page of a block, it is determined whether the tested page has an amount of errors that warrant data relocation according to the data recovery scheme being used. For example, the amount of errors may be compared to a threshold amount, which may be set based on the selected data recovery scheme. For example, one data recover scheme may set that threshold to a high number of errors, other data recovery schemes may set the threshold to lower numbers of errors. The number of errors may refer to a number of bit errors, such as a number of memory cells within the page that have a bit error.

In step 211, yes and step 212, if a tested page has a number of errors equal to or above the threshold amount, then an entire block in which the page is located can be relocated to a new block. In this way, data recovery for a first block includes relocating the data of the first block to another block. In addition, because the whole first block is relocated, in some embodiments, any further testing of that block can be skipped, even if the selected target page scheme would have otherwise tested more pages of the block.

In step 211, no and step 214, if the tested page does not have a sufficient number of errors to warrant data relocation according to the data relocation scheme being used during that data relocation procedure (e.g., the number of errors in the page are below the threshold amount), then it is determined whether any pages remain for testing/error detection in the block, based on the target page scheme. If not (step 214, no and step 216), none of the data for the block in which the page is located is relocated during that data relocation procedure. The process then continues to step 218, where it is determined whether error detection is complete. If not, e.g., there are more blocks to test according to the selected target page scheme, then the data relocation procedure continues to step 219 to test a next, different block, and to step 208 for a next target page in the next block (e.g., a second block compared to the first block already tested).

If more pages within the block remain to be tested according to the target page scheme (step 214, yes), then a next page is tested (steps 215, 211), and the process continues.

One loop of steps 208 through 218 may be described as a data recovery, or data relocation, procedure. For example, the data relocation procedure may perform data relocation for an entire storage device or portion of a storage device using a single recovery scheme.

Then, in step 218, yes, it is determined that the error detection, and thus the data relocation using the selected recovery scheme is complete.

Next, in step 221, it is determined whether the performance has been recovered. For example, based on the desired performance threshold (e.g., step 202), it is determined if the performance, such as the data read speed, is above or below the threshold. If it is above the threshold, then the data recovery method ends. If it is below the threshold, then a different relocation scheme can be selected (step 204), and a second data relocation procedure can be performed (e.g., steps 208 through 218). A different target page scheme can optionally be selected (step 206) for the second data relocation procedure. Alternatively, the same target page scheme as used during the first data relocation procedure can be selected.

As an example, a data recovery scheme using a first threshold amount of errors may be used during the first data recovery procedure, and a second threshold scheme having a second threshold amount of errors smaller than the first threshold number may be used during the second data recovery procedure. As a result, in one embodiment, the first data recovery procedure relocates blocks of data for which at least one page has the first threshold amount of errors, and does not relocate blocks of data for which no pages have the first threshold amount of errors or more than the first threshold amount of errors. The second data recovery procedure relocates blocks of data for which at least one page has the second threshold amount of errors, and does not relocate blocks of data for which no pages have at the second threshold number of errors, the first threshold amount of errors, or more than the first threshold amount of errors.

Further details relating to the various steps shown in FIG. 2 will be described below, in connection with various other figures. For ease of discussion, the term "memory blocks" may be used herein to refer to physical blocks of memory cells of a memory. The term "data block" may be used to refer to a block of data stored, for example, in a memory block. Certain operations described herein relocate a data block from one memory block to another memory block. In addition, in the case where the bits of data in the first memory block have errors, the data relocated to the second memory block may be corrected before being written to the second memory block, and therefore, may be referred to as bit-corrected data (e.g., a bit-corrected data block).

Figure 2A:
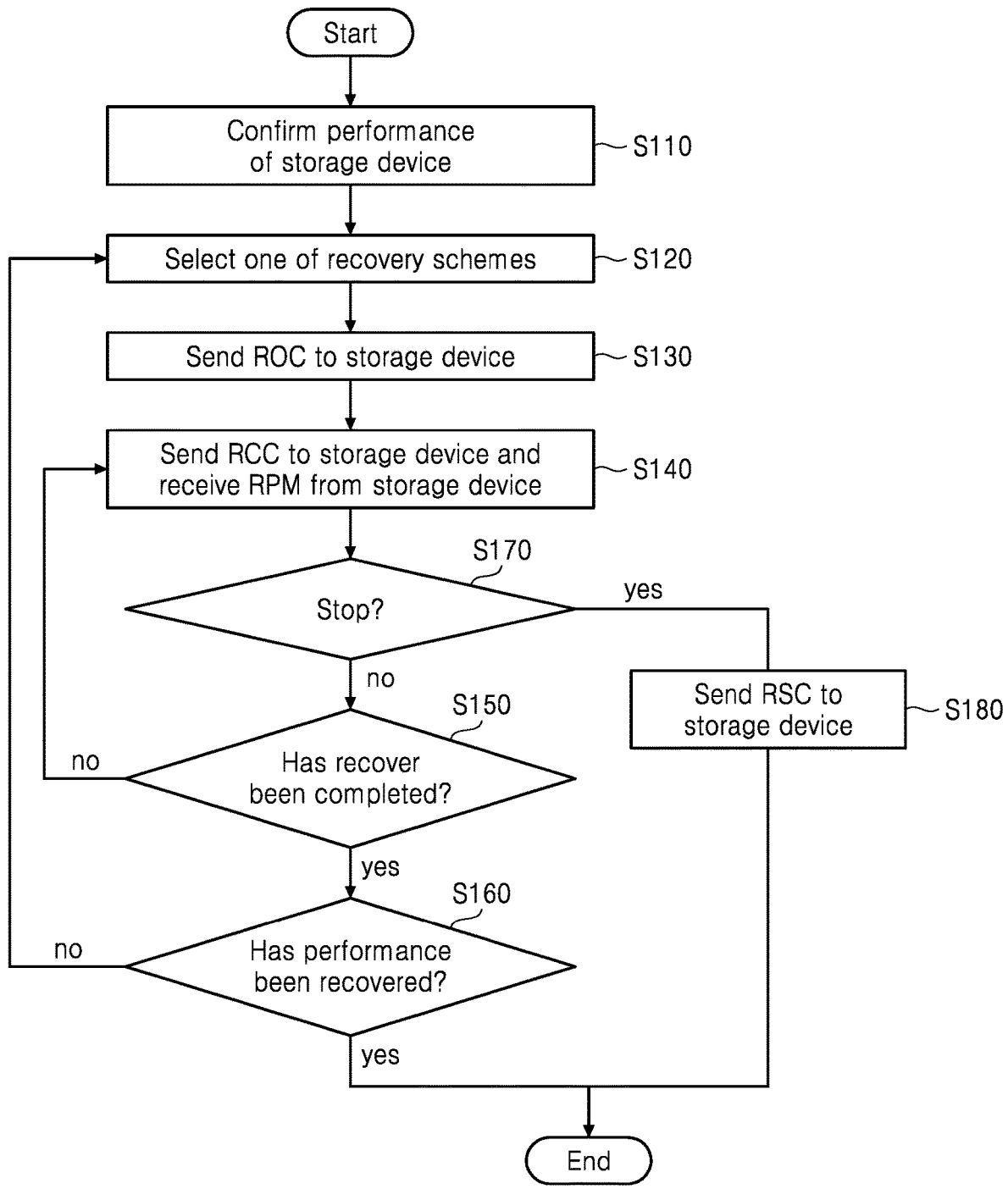
FIG. 2A is a flowchart of the operation of a host according to some embodiments.

FIG. 2A is a flowchart of an exemplary operation of the host 10 according to some embodiments. Referring to FIG. 2A, the host 10 may confirm the performance of the storage device 20 in operation S110. For example, the host 10 may read a random block of the storage device 20 in order to confirm the performance of the storage device 20. The random block may be at least one block randomly selected from among all blocks included in the storage device 20 and may include a plurality of pages. For example, the host 10 may read the pages included in the random block. The host 10 may send a read command for the random block to the storage device 20. The host 10 may generate a performance confirmation result including information about the degree of degradation of a read operation based on a read time taken for the storage device 20 to read the random block.

In operation S120, the host 10 may select a recovery scheme from among a plurality of recovery schemes based on the performance confirmation result. The host 10 may determine whether the performance will be recovered by continuously performing a read operation based on the performance confirmation result. The host 10 may suggest to a user at least one of the plurality of recovery schemes based on the determination result. An example of this operation will be included in more detail in the description of the embodiments illustrated in FIG. 11.

The host 10 may provide a user interface (UI) which suggests a user at least one of the recovery schemes. The host 10 may select one of the recovery schemes according to the user's choice. Alternatively, the host 10 may be programmed to automatically select a recovery scheme based on the results of the performance evaluation. The plurality of recovery schemes may include a first recovery scheme, a second recovery scheme, a third recovery scheme, etc.

One recovery scheme may be a scheme which weakens the execution conditions of data relocation during a read operation during a data recovery operation mode of the storage device 20. In this case, data relocation may be more frequently executed when the first recovery scheme is used. The second recovery scheme may be a scheme which strengthens the execution conditions of data relocation during a read operation during a data recovery mode of the storage device 20. In this case, data relocation may be less frequently executed when the second recovery scheme is used than when the first recovery scheme is used. The more frequent execution of data relocation associated with the first recovery scheme may correspond to a smaller threshold amount of bit errors, such as discussed above, while the less frequent execution of data relocation associated with the second recovery scheme may correspond to a larger threshold amount of bit errors. The different recovery schemes will be described in further detail below with reference to FIGS. 6 through 9.

The host 10 may also suggest a user at least one of a plurality of target page schemes. The host 10 may provide a UI which suggests a user at least one of the target page schemes. The plurality of target page schemes may include, for example, a first page scheme, second page scheme, and third page scheme.

The first page scheme may be for setting all of pages included in every block as target pages. The second page scheme may be for setting at least one reference page included in every block, but not every page, as a target page. A recovery time in the second page scheme may be shorter than that in the first page scheme, though the first page scheme may be more accurate. A third page scheme may select random pages throughout a memory device as target pages.

The host 10 may select one of the target page schemes according to the user's choice. Alternatively, the host 10 may select one of the target page schemes automatically. The host 10 may generate recovery scheme information regarding the selected recovery scheme and target page information regarding the selected target page scheme. Examples of this will be described in more detail with reference to FIG. 5.

The host 10 may send a recovery mode command ROC to the storage device 20 in operation S130. The recovery mode command ROC may include the recovery scheme information and the target page information. The recovery scheme information may be information corresponding to the first recovery scheme, the second recovery scheme, or another different recovery scheme. The target page information may be information corresponding to the first target page scheme, second target page scheme, or third target page scheme, for example.

The host 10 may send a recovery confirmation command RCC to the storage device 20 and may receive a recovery processing message RPM from the storage device 20 in operation S140. The recovery processing message RPM may include information indicating the degree of progress toward recovery. For instance, when the recovery is completed 50%, information indicating 50 may be included in the recovery processing message RPM. When the recovery is completed 100%, information indicating 100 may be included in the recovery processing message RPM.

The host 10 may determine whether the recovery of the storage device 20 is fully completed based on the recovery processing message RPM received from the storage device 20 in operation S150. For instance, when receiving the recovery processing message RPM including information indicating 100, the host 10 may determine that the recovery of the storage device 20 has been fully completed. However, when receiving the recovery processing message RPM including information indicating a number other than 100, the host 10 may determine that the recovery of the storage device 20 has not been completed.

When it is determined that the recovery of the storage device 20 has not been completed, the host 10 may return to operation S140 to send the recovery confirmation command RCC and receive the recovery processing message RPM. When it is determined that the recovery of the storage device 20 has not been completed, the host 10 may wait for a predetermined period of time and then send the recovery confirmation command RCC to the storage device 20 and receive the recovery processing message RPM from the storage device 20. Consequently, the host 10 repeatedly sends the recovery confirmation command RCC to the storage device 20 until the recovery of the storage device 20 is completed in order to check the progress of the recovery of the storage device 20.

However, when it is determined that the recovery of the storage device 20 has been completed, the procedure advances to operation S160. The host 10 may determine whether the performance of the storage device 20 has been recovered in operation S160 (e.g., whether the performance is above a desired threshold performance value). When it is determined that the performance of the storage device 20 has not been recovered, the host 10 may return to operation S120 to select another recovery scheme (e.g., a different recovery scheme). Consequently, the host 10 repeatedly sends the recovery mode command ROC until the performance of the read operation of the storage device 20 is recovered in order to recover the performance of the read operation of the storage device 20.

The host 10 may determine whether to stop the recovery mode during the recovery of the storage device 20 in operation S170. For example, the host 10 may provide a user with a UI asking whether to stop the recovery mode. The host 10 may decide to stop the recovery mode according to the user's choice. Although operation S170 is performed between operations S140 and S150 in the embodiments illustrated in FIG. 2A, the inventive concept is not restricted to the current embodiments. Operation S170 may be performed any moment after the host 10 sends the recovery mode command ROC to the storage device 20 in operation S130 and before the host 10 determines whether the performance has been recovered in operation S160. When the host 10 decides not to stop the recovery mode of the storage device 20, the procedure goes to operation S150.

When the host 10 decides to stop the recovery mode of the storage device 20, the host 10 may send a recovery stop command RSC to the storage device 20 in operation S180. In detail, when the host 10 decides to stop the recovery mode, the host 10 may send the recovery stop command RSC to the storage device 20 and may receive a recovery stop message RSM from the storage device 20. The recovery stop message RSM may include information indicating the degree of progress in the recovery. The host 10 may determine whether the performance of the storage device 20 has been recovered based on the recovery stop message RSM.

Figure 2B:
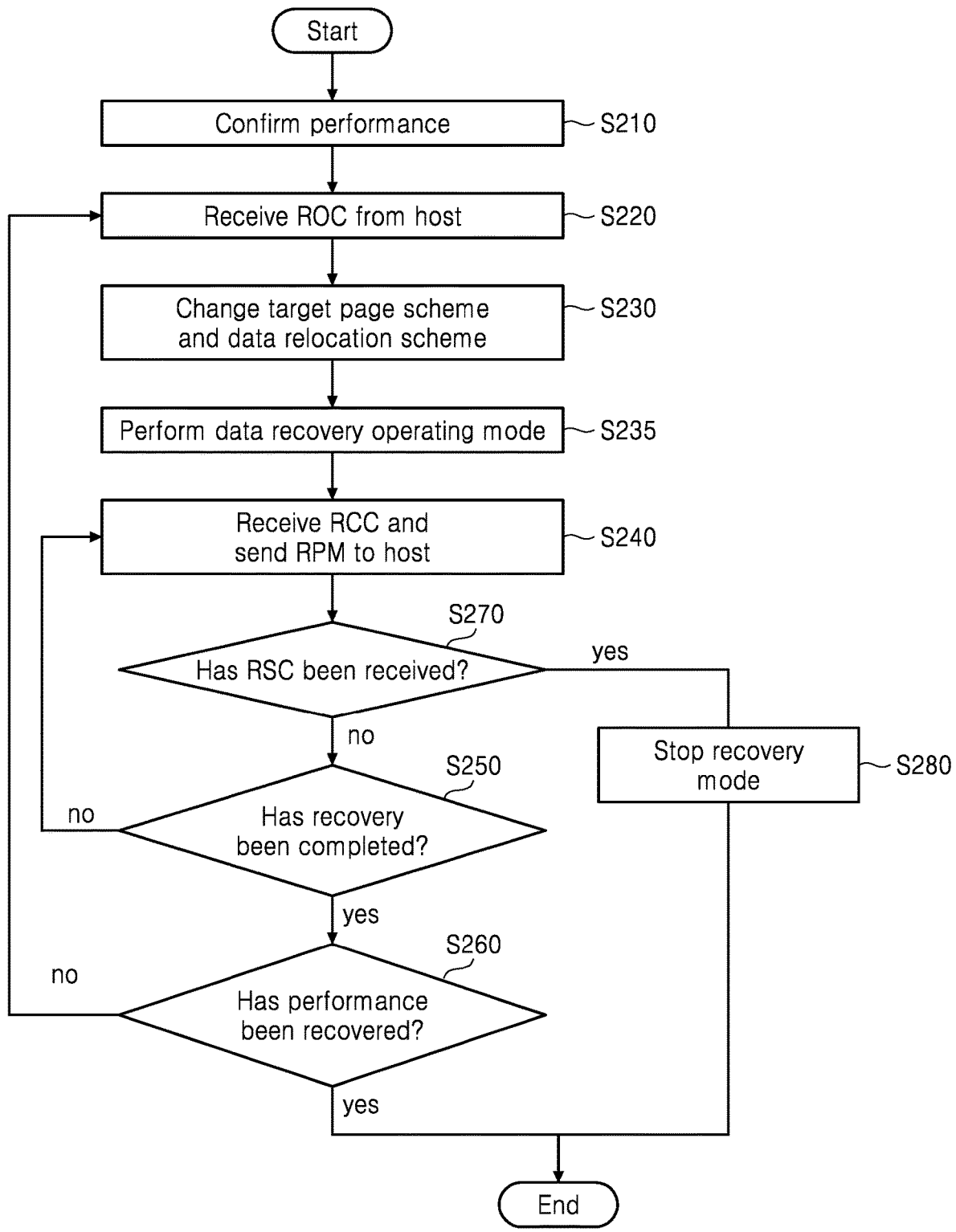
FIG. 2B is a flowchart of the operation of a storage device according to some embodiments.

FIG. 2B is a flowchart of an exemplary operation of the storage device 20 according to some embodiments. To avoid redundancy, details overlapping the description of the operation of the host 10 illustrated in FIG. 2A will be omitted.

Referring to FIG. 2B, the storage device 20 may confirm its performance in operation S210. For example, the storage device 20 may read a random block in order to confirm the performance. In detail, the storage device 20 may receive a read command for the random block from the host 10.

The storage device 20 may receive the recovery mode command ROC from the host 10 in operation S220. The storage device 20 may set or change a target page scheme and a data relocation scheme in operation S220. The data relocation scheme may be a scheme about under what condition will data relocation be executed. The storage device 20 may dynamically change the target page scheme according to the target page information and may dynamically change the data relocation scheme according to the recovery scheme information. "Dynamically changing" may signify changing into a certain condition according to information such as target page information and recovery scheme information, and may occur automatically in some implementations.

For instance, the storage device 20 may change the data relocation scheme based on the first recovery scheme when the recovery scheme information corresponds to the first recovery scheme and may change the data relocation scheme based on the second recovery scheme when the recovery scheme information corresponds to the second recovery scheme. The first recovery scheme may be for weakening data relocation conditions and the second recovery scheme may be for strengthening the data relocation conditions. The storage device 20 may set or change the target page scheme in the similar manner to the one described above.

The storage device 20 may enter the data recovery operating mode in operation S230. This operation will be described in detail with reference to FIGS. 6 through 9 later.

The storage device 20 may receive the recovery confirmation command RCC from the host 10 and may send the recovery processing message RPM to the host 10 in operation S240. Operation S240 may be the same as operation S140.

The storage device 20 may determine whether the recovery is completed in operation S250 (e.g., whether all blocks have been checked according to the target page scheme). When it is determined that the recovery has not been completed, the storage device 20 may return operation S240 to receive the recovery confirmation command RCC and send the recovery processing message RPM.

The storage device 20 may determine whether its performance has been recovered in operation S260. When it is determined that the performance has not been recovered, the storage device 20 may return to operation S220 to receive the ROC from the host, and to perform another data recovery procedure, for example using a different target page scheme and/or data relocation scheme.

The storage device 20 may determine whether the recovery stop command RSC has been received from the host 10 in operation S270. When the recovery stop command RSC has been received, the storage device 20 may stop the data recovery operating mode in operation S280. After stopping the data recovery operating mode, the storage device 20 may send the recovery stop message RSM to the host 10.

The operation of the storage device 20 may correlate with the operation of the host 10. Accordingly, although not described here, commands and/or messages may be transferred between the storage device 20 and the host 10 using typical methods.

FIG. 3 is a flowchart of an exemplary method of operating the data processing system 1 according to some embodiments. Referring to FIG. 3, the host 10 may read a random block of the storage device 20 to confirm the performance of the storage device 20 and may generate a performance confirmation result in operation S110. The host 10 may select one of a plurality of recovery schemes based on the performance confirmation result in operation S120. The host 10 may send the recovery mode command ROC to the storage device 20 in operations S130 and S220. The recovery mode command ROC may designate a data relocation scheme and target page scheme for the storage device 20 to use during a data recovery procedure.

The storage device 20 may set or change a target page scheme and a data relocation scheme based on the recovery mode command ROC received from the host 10 in operation S230.

The storage device 20 may perform a data recovery method during a data recovery operation mode, the data recovery method corresponding to the recovery mode command ROC in operation S235. The data recovery procedure of the storage device 20 may include setting a target page and performing a read operation on the target page. In detail, the storage device 20 may set a target page, perform a read operation on the target page, and perform data relocation according to an error bit level (e.g., a number of bit errors in each tested page of a plurality of tested pages) in the recovery mode according to the recovery scheme.

The storage device 20 may set the target page based on the target page information included in the recovery mode command ROC. A plurality of target page schemes may include a first page scheme, a second page scheme, and a third page scheme.

The first page scheme may be a scheme of setting all of pages included in every block as target pages. According to the first page scheme, the storage device 20 may perform a read operation on all of the pages included in each block. Since the read operation is performed on all pages, it takes a long time but is more accurate in performance recovery.

The second page scheme may be a scheme of setting at least one reference page included in each of blocks in the storage device 20 as a target page. According to the second page scheme, the storage device 20 may perform a read operation on at least one reference page included in each block. The at least one reference page may be a page representing the characteristic of the block including the reference page.

The third page scheme may be a scheme of setting random pages among a plurality of pages included in each of blocks included in the storage device 20 as target pages. According to the third page scheme, the storage device 20 may perform a read operation on the target pages randomly selected from among the pages included in each block. Since a read operation is performed on random pages, it takes a short time but is limited in accuracy for performance recovery.

The storage device 20 may also perform the read operation on a target page according to a recovery scheme selected according to recovery scheme information included in the recovery mode command ROC. A plurality of recovery schemes may include a first recovery scheme, a second recovery scheme, and a third recovery scheme.

The first recovery scheme may be a scheme which weakens the execution conditions of data relocation during the read operation of the storage device 20. For example, data relocation may be more frequently executed in the first recovery scheme. The second recovery scheme may be a scheme which strengthens the execution conditions of the data relocation during the read operation of the storage device 20. For example, the data relocation may be executed less frequently in the second recovery scheme than in the first recovery scheme. The third recovery scheme may be a scheme which further strengthens the execution conditions of the data relocation during the read operation of the storage device 20. For example, in one embodiment, the third recovery scheme does not execute data relocation during the read operation of the storage device 20. The different recovery schemes may be based on a different threshold amount of errors that need to be detected to perform relocation of data from a first block to a second block. Additional schemes besides the first through third may be implemented as well. Example schemes will be described in detail with reference to FIGS. 6 through 9 below. When receiving the recovery mode command ROC, the storage device 20 may send a recovery mode message ROM to the host 10.

As described above, the host 10 may repeatedly send the recovery confirmation command RCC to the storage device 20 and receive the recovery processing message RPM from the storage device 20 until the recovery is completed in operations S140 and S250. The recovery processing message RPM may include information indicating the degree of progress of the recovery. For instance, when the recovery is 50% completed, information indicating 50 may be included in the recovery processing message RPM. When the recovery is 100% completed, information indicating 100 may be included in the recovery processing message RPM. Thus, each individual data recovery procedure (e.g., testing all blocks of a storage device using a selected target page scheme and data relocation scheme) can be executed by the storage device 20 without further interaction by the host 10. For example, the data recovery procedure may be controlled by the memory controller 100 based on a command from the host 10 received at the memory controller 100 indicating a target page scheme and data relocation scheme. Error detection as well as data relocation can be performed by control circuitry at the memory controller 100 performing accesses to the memory device 200.

The host 10 may determine whether the recovery of the storage device 20 has been completed based on the recovery processing message RPM received from the storage device 20. For instance, when receiving the recovery processing message RPM including the information indicating that the recovery has been 100% completed, the host 10 may recognize that the recovery has been completed.

Thereafter, the host 10 may determine whether performance recovery has been completed based on the recovery processing message RPM in operations S160 and S260. The host 10 may determine about the completion of the performance recovery using the same method as the method of confirming the performance of the storage device 20.

FIG. 4 is a flowchart of a method of operating the data processing system 1 according to other embodiments of the inventive concept. To avoid redundancy, the description will be focused on the differences between the flowchart illustrated in FIG. 4 and the flowchart illustrated in FIG. 3.

The host 10 may decide whether to stop the recovery mode during the data recovery operating mode of the storage device 20. The host 10 may provide a user with a UI asking whether to stop the data recovery operating mode of the storage device 20. The host 10 may determine whether to stop the data recovery operating mode of the storage device 20, for example, according to the user's choice. Alternatively, the host 10 itself may automatically interrupt a data recovery operating mode automatically.

When the data recovery operating mode of the storage device 20 is to be stopped, the host 10 may send the recovery stop command RSC to the storage device 20. In detail, when the host 10 decides to stop the data recovery operating mode, the host 10 may send the recovery stop command RSC to the storage device 20 and receive the recovery stop message RSM from the storage device 20. When the storage device 20 receives the recovery stop command RSC, it may stop the data recovery operating mode and may send the recovery stop message RSM to the host 10.

The recovery stop message RSM may include information indicating the degree of progress of the recovery. The host 10 may determine whether performance has been recovered based on the recovery stop message RSM.

Figure 5:
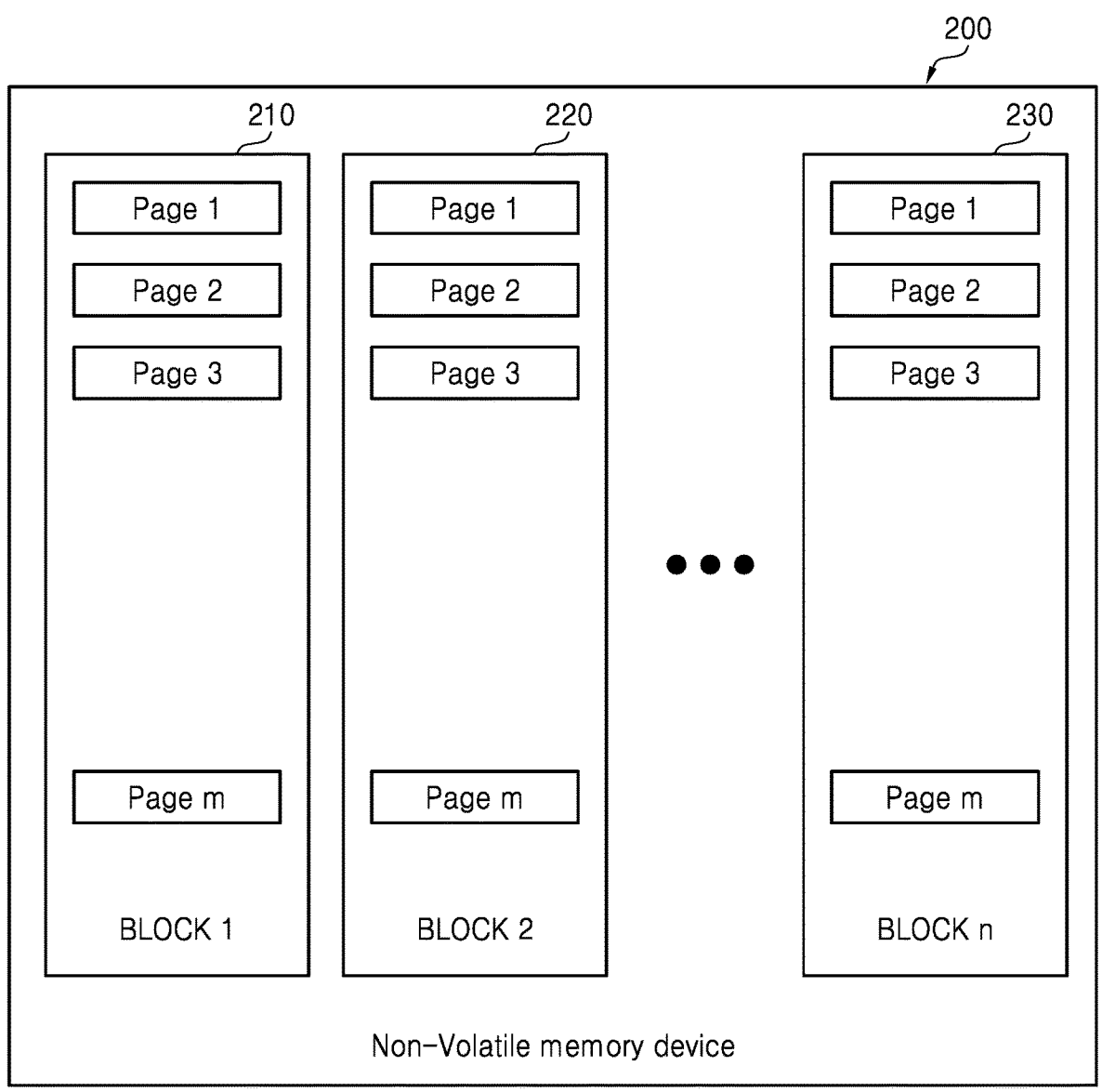
FIG. 5 is a block diagram of a non-volatile memory device according to some embodiments.

FIG. 5 is a block diagram of the non-volatile memory device 200 according to some embodiments. Referring to FIG. 5, the non-volatile memory device 200 may include first through n-th blocks BLOCK1 through BLOCKn or 210 through 230, where "n" is a natural number. Each of the first through n-th blocks BLOCK1 through BLOCKn may include first through m-th pages Page1 through Pagem, where "m" is a natural number.

Each of the first through m-th pages Page1 through Pagem may include a plurality of memory cells. Each page may be defined by a plurality of memory cells connected to at least one word line. Each page may include a row of memory cells. For example, in some embodiments, each page may include only one row of memory cells. In other embodiments, each page may include more than one row of memory cells.

A plurality of target page schemes may include a first page scheme, a second page scheme, and a third page scheme. The first page scheme may be a scheme of setting all of the pages Page1 through Pagem included in each of all blocks BLOCK1 through BLOCKn in the non-volatile memory device 200 included in the storage device 20 as target pages. According to the first page scheme, the storage device 20 may perform a read operation on all of the pages Page1 through Pagem included in each of all blocks BLOCK1 through BLOCKn.

The second page scheme may be a scheme of setting at least one reference page included in each of all blocks BLOCK1 through BLOCKn in the non-volatile memory device 200 included in the storage device 20 as a target page. According to the second page scheme, the storage device 20 may perform a read operation on at least one reference page included in each of all blocks BLOCK1 through BLOCKn.

The at least one reference page may be pages (e.g., Page3k, where 0<k≤a natural number satisfying m/3) corresponding to multiples of three, but the inventive concept is not restricted to the current embodiments. The at least one reference page may be a page representing the characteristic of each of the blocks BLOCK1 through BLOCKn which includes the at least one reference page. The number of reference pages included in each of the blocks BLOCK1 through BLOCKn may be restricted to three. For instance, when each block includes 384 pages, the storage device 20 may perform the recovery mode at least 100 times faster in the second page scheme than in the first page scheme.

The third page scheme may be a scheme of setting random pages among the pages Page1 through Pagem included in each of the blocks BLOCK1 through BLOCKn included in the storage device 20 as target pages. For instance, the third page Page3 may be set as a target page in the first block BLOCK1 or 210, the fifth page Page5 may be set as a target page in the second block BLOCK2 or 220, and the m-th page Pagem may be set as a target page in the n-th block BLOCKn or 230.

FIG. 6 is a table of the criteria of data relocation in a first recovery scheme according to some embodiments of the inventive concept. FIG. 7 is a table of the criteria of data relocation in a second recovery scheme according to some embodiments of the inventive concept. FIG. 8 is a table of the criteria of data relocation in a third recovery scheme according to other embodiments of the inventive concept. FIG. 9 is a table of the criteria of data relocation in a fourth recovery scheme according to some embodiments of the inventive concept.

Referring to FIGS. 6 through 9, the storage device 20 which has entered a data recovery operating mode according to a selected recovery scheme may perform a read operation on target pages based on the tables illustrated in FIGS. 6 through 9. Generally, a read operation may be performed on each page in the storage device 20 (according to a target page scheme) and a data relocation scheme may be performed on each block.

Referring to FIG. 6, the first recovery scheme may weaken the conditions of data relocation during the recovery mode of the storage device 20. For example, data relocation may be more frequently performed in the first recovery scheme than in any other recovery schemes.

When the number of bit errors in a page that has been read by the storage device 20 among a plurality of target pages is in a first error range ER1, the storage device 20 may correct data stored in the page using a first correction method, such as a hardware method (e.g., a method using an LDPC code). When the number of bit errors is in a second error range ER2, a third error range ER3, or a fourth error range ER4, the storage device 20 may correct the data stored in the page that has been read using a second correction method, such as a software method (e.g., a method using an algorithm for recovering error bits) and may perform data relocation on a block including the page.

The data relocation may include a rewrite operation. The data relocation may be an operation of writing existing data to a different region than a region (e.g., a memory block) in which the data has been stored. The rewrite operation may be rewriting the existing data, such as a block of data stored in a first memory block, from the first memory block to a second memory block. For instance, when the storage device 20 performs data relocation on the first block BLOCK1 illustrated in FIG. 5, data stored in the pages Page1 through Pagem included in the first block 210 may be written to a plurality of pages included in any one of the second through n-th blocks BLOCK2 through BLOCKn. As can be seen from FIG. 6, a threshold amount of errors (e.g., bit errors) in a page for performing relocation is a second level (e.g., it can be 2 bit errors). If the amount of errors determined while reading/testing that page during a data recovery procedure is that level or more, then all data in the block corresponding to the tested page is relocated to a different block. If, after testing all pages of the block according to the target page scheme, none of them have the second level or more errors, then no data in the block will be relocated during the data recovery operating mode.

Referring to FIG. 7, the second recovery scheme may strengthen the conditions of data relocation during the recovery mode of the storage device 20. For example, data relocation may be less frequently performed in the second recovery scheme than in the first recovery scheme. In order to avoid redundancy, the description will be focused on the difference between the table illustrated in FIG. 7 and the table illustrated in FIG. 6.

When the number of bit errors in a page that has been read by the storage device 20 among a plurality of target pages is in the first error range ER1, the storage device 20 may correct data stored in the page using a first correction method, such as a hardware method (e.g., a method using an LDPC code). When the number of bit errors is in the second error range ER2, the storage device 20 may correct the data stored in the page that has been read using a second correction method, such as a software method (e.g., a method using an algorithm for recovering error bits). When the number of bit errors is in the third error range ER3 or the fourth error range ER4, the storage device 20 may correct the data stored in the page that has been read using a third correction method, such as a software method (e.g., a method using an algorithm for recovering error bits, which may be the same as the second correction method) and may perform data relocation on a block including the page.

As can be seen from FIG. 7, a threshold amount of errors (e.g., bit errors) in a page for performing relocation is a third level (e.g., can be 3 bit errors). If the amount of errors determined while reading/testing that page during a data recovery procedure is the third level or more, then all data in the block corresponding to the tested page is relocated to a different block. If, after testing all pages of the block according to the target page scheme, none of them have the third level or more errors, then no data in the block will be relocated during the data recovery operating mode.

Referring to FIG. 8, the third recovery scheme may further strengthen the conditions of data relocation during the recovery mode of the storage device 20. For example, data relocation may be less frequently performed in the third recovery scheme than in the first or second recovery schemes. In order to avoid redundancy, the description will be focused on the difference between the table illustrated in FIG. 8 and the table illustrated in FIGS. 6 and 7.

When the amount of bit errors in a page that has been read by the storage device 20 among a plurality of target pages is in the first error range ER1, the storage device 20 may correct data stored in the page using a first correction method, such as a hardware method (e.g., a method using an LDPC code). When the amount of bit errors is in the second error range ER2 or the third error range ER3, the storage device 20 may correct the data stored in the page that has been read using a second correction method, such as a software method (e.g., a method using an algorithm for recovering error bits). When the amount of bit errors is in the fourth error range ER4, the storage device 20 may correct the data stored in the page that has been read using a third correction method, such as a software method (e.g., a method using an algorithm for recovering error bits, which may be the same as the second correction method) and may perform data relocation on a block including the page.

As can be seen from FIG. 8, a threshold amount of errors (e.g., bit errors) in a page for performing relocation is a fourth level (e.g., can be 4 bit errors). If the amount of errors determined while reading/testing that page during a data recovery procedure is the fourth level or more, then all data in the block corresponding to the tested page is relocated to a different block. If, after testing all pages of the block according to the target page scheme, none of them have the fourth level or more errors, then no data in the block will be relocated during the data recovery operating mode.

Though examples are given here with respect to a number of errors in a particular page, in some embodiments, a number of pages that have the threshold amount of errors may be determined and used as a threshold to determine whether to perform data relocation or not. For example, certain data recovery schemes may be set to perform data relocation based on a threshold in a manner similar to that described above, but where the threshold is a number of pages in a block that have errors, or a number of pages in a block that have at least a threshold number of errors.

Referring to FIG. 9, the fourth recovery scheme may not perform data relocation during the recovery mode of the storage device 20. For example, data relocation may not be performed in the third recovery scheme. In order to avoid redundancy, the description will be focused on the difference between the table illustrated in FIG. 9 and the table illustrated in FIG. 6.

When the number of bit errors in a page that has been read by the storage device 20 among a plurality of target pages is in the first error range ER1, the storage device 20 may correct data stored in the page using a first correction method, such as hardware method (e.g., a method using an LDPC code). When the number of bit errors is in the second error range ER2, the third error range ER3, or the fourth error range ER4, the storage device 20 may correct the data stored in the page that has been read using a second correction method, such as a software method (e.g., a method using an algorithm for recovering error bits).

In some embodiments, the first recovery scheme may be merged with the first target page scheme (e.g., all pages in each block are designated as target pages); the second or third recovery schemes may be merged with the second target page scheme (e.g., at least one but less than all pages in each block are designated as target pages); and the fourth recovery scheme may be merged with the third target page scheme (random pages are designated as target pages).

In other embodiments, a recovery scheme and a target page scheme may be independently selected and a recovery mode may be performed according to the individual schemes. For instance, when there are first through third recovery schemes and first through third page schemes, the storage device 20 may perform the data recovery operation mode in a total of twelve (3*4) ways.

Though examples of first through fourth levels bit errors are described above with numbers of errors such as 1-4 being given as examples, FIGS. 6-9 also represent each of first through fourth error ranges ER1 through ER4 may be a range of a bit error level. The bit error level may be expressed as the number of bit errors per data stored in a page. For instance, the first error range ER1 may be at least 0% and less than 40%; the second error range ER2 may be at least 40% and less than 80%; the third error range ER3 may be at least 80% and less than 90%; and the fourth error range ER4 may be at least 90% and up to 100%, but the inventive concept is not restricted to this example. Thus, a threshold amount of errors may refer to an absolute number of errors (e.g., 1, 2, 3, 4, etc., bit errors) or a percentage of errors per data stored in a page, such a ratio of number of bit errors to data stored in a page (e.g., up to 40%, 40% to 80%, 80% to 90%, and more than 90%, bit errors per data).

FIG. 10 is a table showing an example of data recovery during a normal read operation, according to one embodiment. As can be seen, in one embodiment, during a normal read operation, when a page includes an amount of errors in the first error range (ER1), the errors are corrected using a hardware method, such as error correction using LDPC. When a page includes an amount of errors in a second or third error range (ER2 or ER3), the errors are corrected using a software method, for example using an algorithm. When a page includes an amount of errors in a fourth error range (ER4), the errors are corrected using a software method, for example using an algorithm, and then the block of data that includes the page is rewritten to a new memory block.

Figure 11:
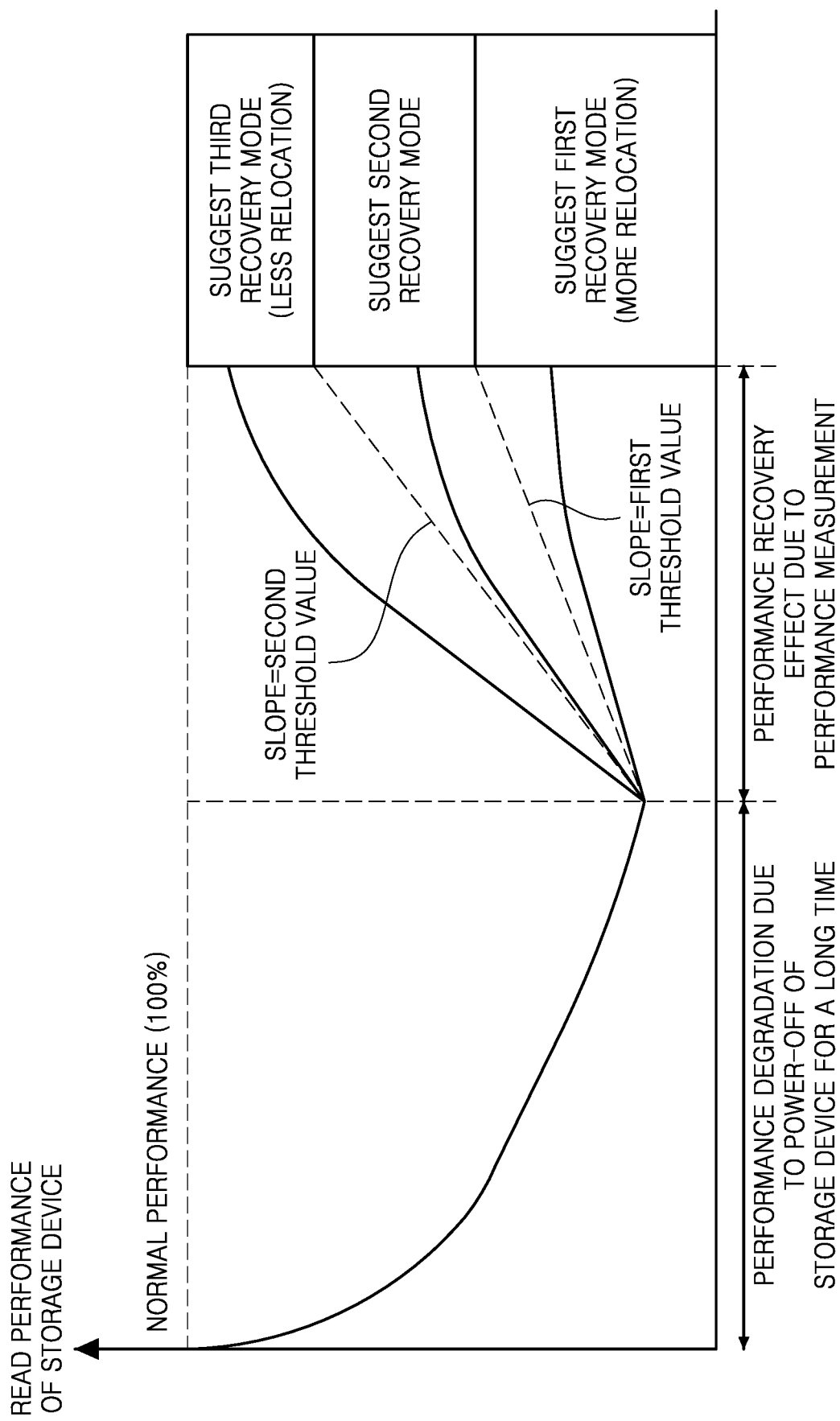
FIG. 11 is a graph showing the conditions of a host's suggestion for a recovery scheme according to some embodiments.

FIG. 11 is a graph showing exemplary conditions of a host's suggestion for a recovery scheme according to some embodiments of the inventive concept. As described above, when power is not supplied to the storage device 20 for a long time, the read performance of the storage device 20 may deteriorate.

An operation of the host 10 measuring the performance of the storage device 20 may include reading a random block in the storage device 20. When the storage device 20 is based on V-NAND, the performance may increase due to WL floating during a read operation. The WL floating may refer to a phenomenon in which performance is recovered to normal after a read operation has been repeatedly performed on a V-NAND flash memory cell.

Accordingly, when the host 10 measures the performance of the storage device 20, a performance recovery effect in which performance gradually gets better may occur, as shown in FIG. 11. In detail, FIG. 11 shows an amount of performance deterioration and subsequent recovery over time. The y-axis represents an amount of performance deterioration, with the top horizontal line reflecting 100% normal performance (e.g., 100% of expected normal data access speed). The x-axis represents time, with the initial time at the left being power-off, and the vertical dotted line representing a time at which power-on occurs. As shown in FIG. 11, during power off, performance gradually deteriorates. Then, starting at power-on, due to the above properties of V-NAND flash memory, performance gradually improves. For example, during normal read operations, some cells are automatically recovered—e.g., charges lost are re-gained. These cells will have better performance, or will cause their associated page/block to have better performance, and can be described as having better retention capability.

Generally, the recovered charges and hence performance will increase over time at a certain rate for different cells/pages. Pages/blocks that have a low rate of automatic recovery (below a line having a first slope) may continue to have more errors, and therefore the host can suggest a recovery scheme for those pages that causes lots of relocation. This would correspond to pages/blocks that have the lowest data retention improvement shown as the bottom line in FIG. 11 after power-on. As can be seen, this bottom line is below the Slope-First Threshold Value line. For example, a recovery scheme such as shown in FIG. 6 or 7 can be used for these pages/blocks.

Pages/blocks that have a high rate of automatic recovery, such as shown in the top line in FIG. 11 after power-on, may have fewer errors over time, and therefore the host can suggest a recovery scheme for those pages that causes less relocation. As can be seen, this top line is above the Slope-Second Threshold Value line. For example, a recovery scheme such as shown in FIG. 8 or 9 can be used for these pages/blocks.

Pages/blocks in between the two sloped lines can have medium recovery profile, and therefore the host can suggest a recovery scheme for those pages that causes a medium amount of relocation between the amount for pages/blocks above the Slope-Second Threshold Value line and the amount for pages/blocks below the Slope-First Threshold Value line. For example, a recovery scheme such as shown in FIG. 7 or 8 can be used for these pages/blocks.

Therefore, different data recovery schemes can be suggested according to the performance recovery properties of the different pages or blocks. For instance, when a performance recovery speed (or an average slope) is equal to or lower than a first threshold value, the host 10 may suggest the first recovery scheme which weakens the conditions of data relocation so that the data relocation is more frequently performed. When the performance recovery speed is at least the first threshold value and at most a second threshold value, the host 10 may suggest the second recovery scheme which strengthens the conditions of data relocation so that the data relocation is less frequently performed than in the first recovery scheme. At this time, the second threshold value may be greater than the first threshold value. When the performance recovery speed is equal to or higher than the second threshold value, the host 10 may suggest the third recovery scheme in which data relocation is even less frequently performed than in the second recovery scheme, or in which data relocation is not performed.

As described above, the host 10 may suggest at least one recovery scheme among a plurality of recovery schemes based on the conditions illustrated in FIG. 11, but the inventive concept is not restricted to the current embodiments.

Figure 12:
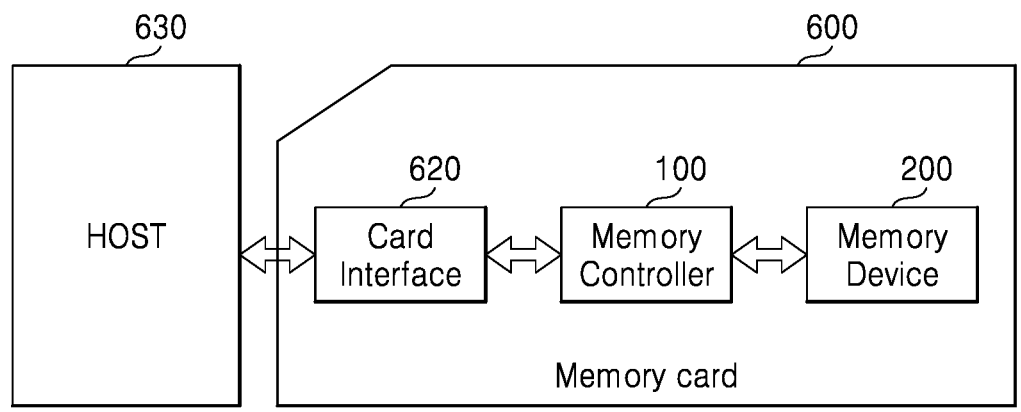
FIG. 12 is a block diagram of a storage device according to some embodiments.

FIG. 12 is a block diagram of a storage device 600 according to some embodiments of the inventive concept. The storage device 600 may be implemented as a memory card or a smart card. The storage device 600 includes the non-volatile memory device 200, a memory controller 100, and a card interface 620.

The memory controller 100 may control data exchange between the memory device 200 and the card interface 620. The card interface 620 may be, for example, a secure digital (SD) card interface or a multi-media card (MMC) interface, but the inventive concept is not restricted to the current embodiments.

The card interface 620 may interface a host 630 and the memory controller 100 for data exchange according to a protocol of the host 630. The card interface 620 may support a universal serial bus (USB) protocol and an interchip (IC)-USB protocol. Here, the card interface 620 may indicate a hardware supporting a protocol used by the host 630, a software installed in the hardware, or a signal transmission mode.

When the storage device 600 is connected with the host 630 such as a PC, a tablet PC, a digital camera, a digital audio player, a cellular phone, a console video game hardware, or a digital set-top box, the host 630 may perform data communication with the non-volatile memory device 200 through the card interface 620 and the memory controller 100.

Figure 13:
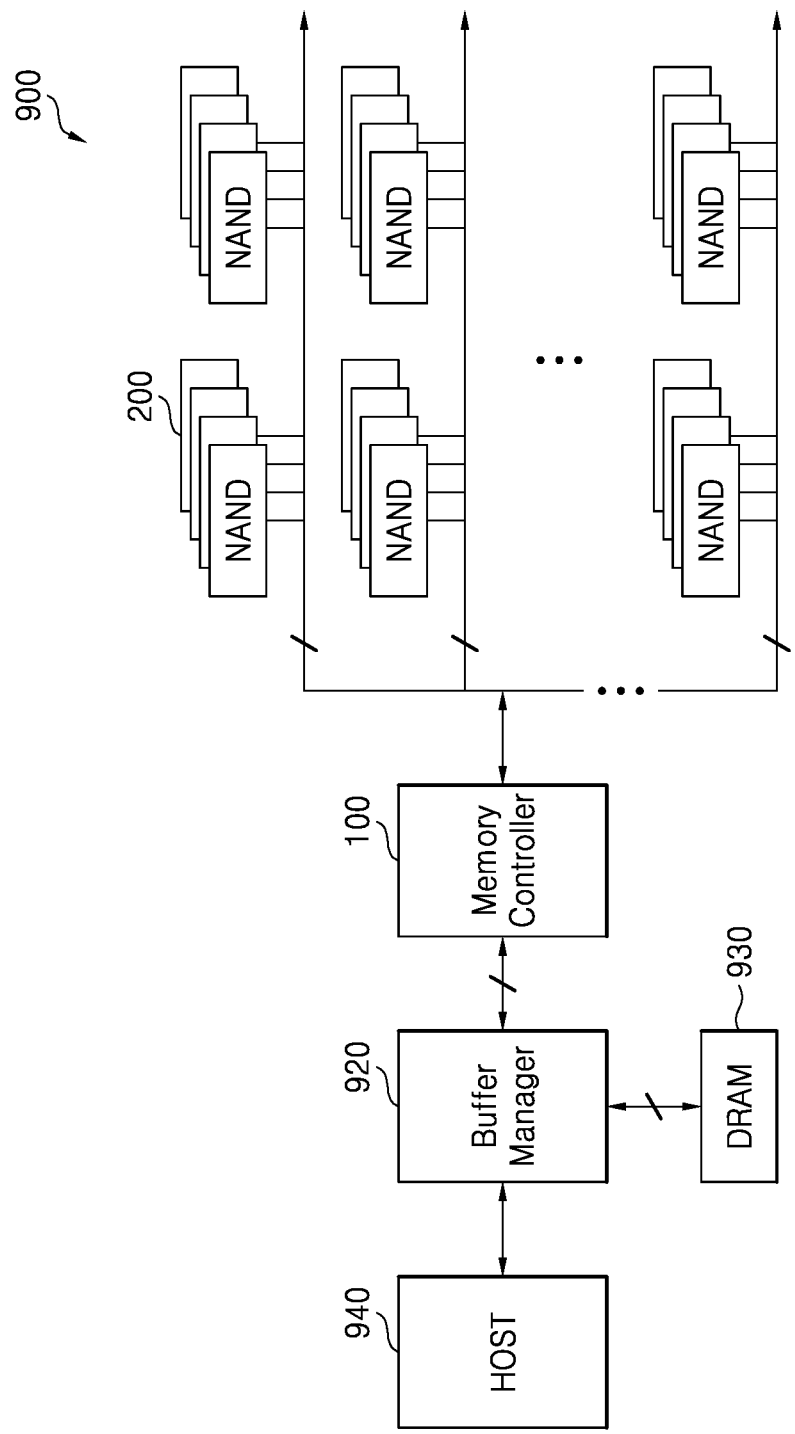
FIG. 13 is a block diagram of a storage device including a non-volatile memory device according to some embodiments.

FIG. 13 is a block diagram of a storage device 900 including a non-volatile memory device according to other embodiments of the inventive concept. The storage device 900 may be implemented as a data storage system like a solid state drive (SSD).

The storage device 900 includes a plurality of non-volatile memory devices 200, a memory controller 100 controlling the data processing operations of the non-volatile memory devices 200, a volatile memory device 930 like a dynamic random access memory (DRAM), and a buffer manager 920 controlling data transferred between the memory controller 100 and a host 940 to be stored in the volatile memory device 930.

Figure 14:
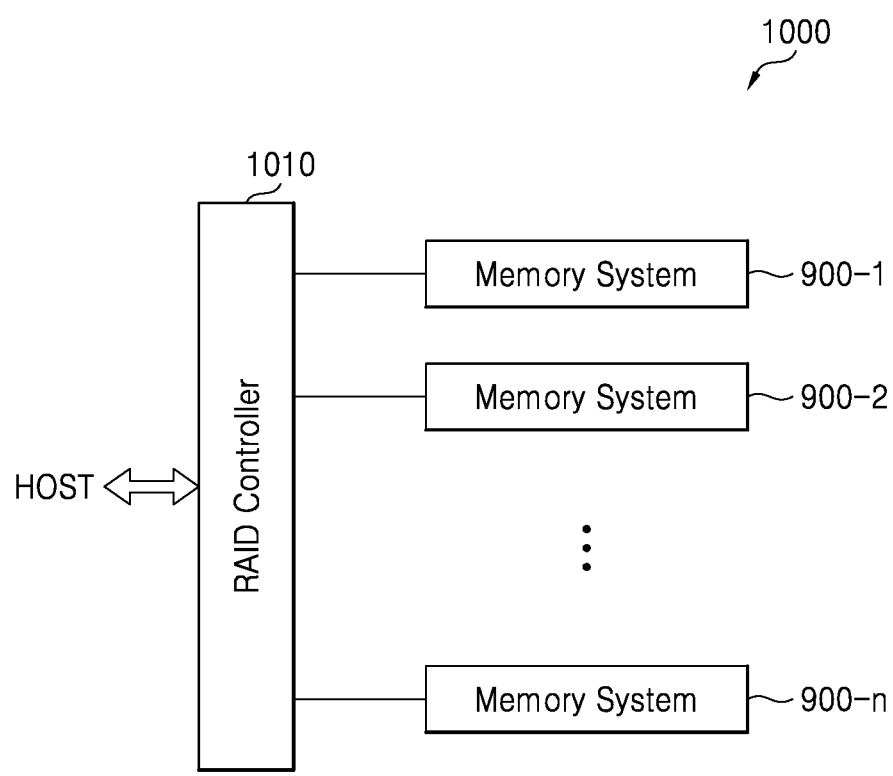
FIG. 14 is a block diagram of a data processing system including a non-volatile memory device according to some embodiments.

FIG. 14 is a block diagram of a data processing system 1000 including a non-volatile memory device according to some embodiments of the inventive concept. The data processing system 1000 may be implemented as a redundant array of independent disks (RAID) system. The data processing system 1000 includes a RAID controller 1010 and a plurality of memory systems 900-1 through 900-n where "n" is a natural number.

The plurality of memory systems 900-1 through 900-n may form a RAID array. The data processing system 1000 may be a PC or an SSD.

During a program operation, the RAID controller 1010 may transmit program data output from a host to at least one of the memory systems 900-1 through 6900-n according to a RAID level in response to a program command received from the host. During a read operation, the RAID controller 1010 may transmit to the host data read from at least one of the memory systems 900-1 through 900-n in response to a read command received from the host.

The present disclosed embodiments can also be embodied as computer-readable codes on a computer-readable medium. For example, aspects of the host, which enable user interaction and selection of different recovery schemes, may be implemented using computer-readable codes (e.g., programs) on a computer-readable recording medium. The computer-readable recording medium is any data storage device that can store data as a program, which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Also, functional programs, codes, and code segments to accomplish aspects of the present disclosed embodiments can be easily construed by programmers.

As described above, according to some embodiments of the inventive concept, a method of operating a data processing system selects a recovery scheme from among a plurality of recovery schemes and enters a data recovery operating mode according to the selected scheme, so that performance degraded due to a retention characteristic is recovered. In addition, a method of reading only a reference page may be used, so that a recovery time is reduced.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A data recovery method for a storage device including a plurality of memory cells arranged in pages and blocks, each page including a row of memory cells, and each block including a plurality of pages of memory cells, the method comprising:
   receiving by the storage device a first command corresponding to a first selected data recovery scheme; and based on the first command:
   applying a first target page scheme for performing error detection on the plurality of blocks;
   reading target pages using the first target page scheme, and detecting an amount of errors in each read target page;
   as part of the first selected data recovery scheme, determining that a target page of a first block has an amount of errors that falls within a first range of errors, a lower boundary of the first range of errors being a first threshold amount of errors, and based on the determination, performing data recovery for the first block by relocating all data stored in the first block to another block;
   as part of the first selected data recovery scheme, determining that no read page in a second block has an amount of errors that falls within the first range of errors, and as a result, maintaining the data stored in the second block without relocating the data;
   receiving by the storage device a second command corresponding to a second selected data recovery scheme; and
   based on the second command:
   applying a second target page scheme for performing error detection on at least the second block and one or more additional blocks;
   reading at least one target page of the second block and at least one target page of the one or more additional blocks using the second target page scheme, and detecting a number of errors in each read target page of the second block;
   as part of the second selected data recovery scheme, determining that a target page of the second block has an amount of errors lower than the first range of errors and that falls within a second range of errors, a lower boundary of the second range of errors being a second threshold amount, and based on the determination, performing data recovery for the second block by relocating all data stored in the second block to another block; and
   determining that no read page in the one or more additional blocks has an amount of errors that falls within the second range of errors, and as a result, maintaining the data stored in the one or more additional blocks,
   wherein the second threshold amount is smaller than the first threshold amount.

2. The data recovery method of claim 1, further comprising:
   performing the receiving, applying, reading, and both determining steps for each of the first and second data recovery schemes during a data recovery operating mode of the storage device, the data recovery operating mode different from a normal read operating mode of the storage device.

3. The method of claim 1, wherein the second target page scheme is the same scheme as the first target page scheme.

4. The method of claim 1, further comprising:
   determining a performance of the storage device; and
   setting the first threshold amount based on the determined performance.

5. The method of claim 4, wherein the determined performance is a speed of reading the storage device.

6. The method of claim 1, wherein the first threshold amount of errors is a first threshold percentage of errors per data stored in a page.

7. A data recovery method for a storage device including a plurality of memory cells arranged in pages and blocks, each page including a row of memory cells, and each block including a plurality of pages of memory cells, the method comprising:
   (a) using a first data recovery procedure at the storage device to recover data on the storage device, the first data recovery procedure using a first data relocation scheme that relocates a block of data when at least one page of the block is determined to have at least a first threshold amount of errors;
   (b) receiving at the storage device a command to use a second, different data recovery procedure; and
   (c) in response to the command, using the second data recovery procedure at the storage device to recover data on the storage device, the second data recovery procedure using a second data relocation scheme that relocates a block of data when at least one page of the block is determined to have at least a second threshold amount of errors, the second threshold amount being smaller than the first threshold amount.

8. The method of claim 7, further comprising:
   prior to step (b), determining a level of performance of the storage device; and
   receiving a selection of the second data recovery procedure based on the determined level of performance.

9. The method of claim 7, wherein:
   the first data recovery procedure includes testing a plurality of blocks to determine, for each block, whether at least one page of the block has at least the first threshold amount of errors; and
   the second data recovery procedure includes testing the plurality of blocks to determine, for each block, whether at least one page of the block has at least the second threshold amount of errors.

10. The method of claim 7, wherein the first data recovery procedure includes a selected target page scheme used to detect errors on pages of the storage device.

11. The method of claim 10, wherein the selected target page scheme is one of:
    a first scheme that performs error detection on a plurality of target pages in each block for a set of blocks of the storage device, the error detection determining, for each target page of the plurality of target pages, whether the target page has at least the first threshold amount of errors;
    a second scheme that performs error detection on a single target page in each block for a set of blocks of the storage device, the error detection determining, for the single target page in each block, whether the target page has at least the first threshold amount of errors; and
    a third scheme that performs error detection on a plurality of target pages randomly selected from the set of blocks of the storage device, the error detection determining, for each target page of the plurality of target pages, whether the target page has at least the first threshold amount of errors.

12. The method of claim 11, wherein:
    according to the first data relocation scheme, when none of the target pages of a particular block of the set of blocks is determined to have at least the first threshold amount of errors and at least one of the target pages of the particular block is determined to have one less than the first threshold amount of errors, the particular block is not relocated during the first data recovery procedure, and according to the second data relocation scheme, when at least one page of a particular block is determined to have one less than the first threshold amount of errors, the particular block is relocated.

13. The method of claim 7, wherein the first threshold amount of errors corresponds to a first threshold number of bit errors, and the second threshold amount of errors corresponds to a second threshold number of bit errors.

14. A data recovery method for a memory device including a plurality of memory cells arranged in pages and blocks, each page including a row of memory cells, and each block including a plurality of pages of memory cells, the method comprising:

determining, by a host, a first performance level of the memory device;

based on the first performance level, selecting a data relocation scheme from among a plurality of data relocation schemes, the plurality of data relocation schemes including a first data relocation scheme and a second data relocation scheme;

sending, by the host, a first command to perform a first data recovery procedure on the memory device, the first data recovery procedure including using the first data relocation scheme, which relocates a block of data of the memory device based on at least one page of the block having at least a first threshold amount of errors, and does not relocate a block of data of the memory device when no pages of the block are determined to have more than a second threshold amount of errors, the second threshold amount being smaller than the first threshold amount;

determining, by the host, a second performance level of the memory device; and based on the second performance level, sending, by the host, a second command to perform a second data recovery procedure on the memory device, the second data recovery procedure including using the second data relocation scheme, which relocates a block of data of the memory device based on at least one page of the block having the second threshold amount of errors.

15. The method of claim 14, wherein the first data recovery procedure occurs during a data recovery operating mode of the memory device, the data recovery operating mode different from a normal read operating mode of the memory device.

16. The method of claim 15, wherein the first data recovery procedure includes:

applying a first target page scheme for performing error detection on the plurality of blocks;

reading target pages using the first target page scheme, and detecting an amount of errors in each read target page;

determining that a target page of a first block has at least a first threshold amount of errors, and based on the determination, performing data recovery for the first block by relocating all data stored in the first block to another block; and determining that no read page in a second block has at least the first threshold amount of errors, and as a result, maintaining the data stored in the second block.

17. The method of claim 15, wherein:

the second data recovery procedure relocates blocks of data for which at least one page is determined to have the second threshold amount of errors, and does not relocate blocks of data for which no pages are determined to have at the second threshold amount of errors, the first threshold amount of errors, or more than the first threshold amount of errors.

* * * * *